(12) United States Patent
Froman

(10) Patent No.: US 8,860,429 B2
(45) Date of Patent: Oct. 14, 2014

(54) SYSTEM AND METHOD FOR DETECTING SENSOR LEAKAGE

(75) Inventor: Gary S. Froman, Fort Worth, TX (US)

(73) Assignee: Textron Innovations Inc., Providence, RI (US)

( * ) Notice: Subject to any disclaimer, the term of this patent is extended or adjusted under 35 U.S.C. 154(b) by 0 days.

(21) Appl. No.: 13/266,605

(22) PCT Filed: Apr. 28, 2010

(86) PCT No.: PCT/US2010/032657
§ 371 (c)(1),
(2), (4) Date: Oct. 27, 2011

(87) PCT Pub. No.: WO2010/126933
PCT Pub. Date: Nov. 4, 2010

(65) Prior Publication Data
US 2012/0038366 A1    Feb. 16, 2012

Related U.S. Application Data

(60) Provisional application No. 61/173,474, filed on Apr. 28, 2009.

(51) Int. Cl.
*G01R 31/02* (2006.01)
*G01R 31/28* (2006.01)
*G01R 31/00* (2006.01)

(52) U.S. Cl.
CPC .......... *G01R 31/2829* (2013.01); *G01R 31/008* (2013.01); *G01R 31/025* (2013.01)
USPC ........... 324/537; 324/522; 324/601; 324/694; 324/698; 324/700

(58) Field of Classification Search
USPC .......... 324/537, 522, 601, 694, 698, 700, 763
See application file for complete search history.

(56) References Cited

U.S. PATENT DOCUMENTS 3,037,161 A    5/1962  R.B. Cummings
4,030,028 A *  6/1977  Allender ...................... 324/698
(Continued)

FOREIGN PATENT DOCUMENTS

DE    10044264 A1    10/2001
EP    0255143 A2     2/1988
(Continued)

OTHER PUBLICATIONS

International Search Report and the Written Opinion of the International Searching Authority mailed by ISA/US on Jul. 7, 2010 for International Patent Application No. PCT/US10/32657, 10 pages.

(Continued)

*Primary Examiner* — Tung X Nguyen
*Assistant Examiner* — Giovanni Astacio-Oquendo
(74) *Attorney, Agent, or Firm* — James E. Walton; Brian E. Harris

(57) ABSTRACT

A test system for testing a sensor system includes a high-impedance resistor for forming a voltage divider with any corrosion or foreign substance that might be present between a signal conductor and a ground conductor. While a voltage is applied across the voltage divider, the voltage can be measured across the high-impedance resistor for determining whether an undesirable amount of conductance exists between the signal wire and ground. The test system also includes switching means for switching between any number of signal wires of a system undergoing testing.

16 Claims, 6 Drawing Sheets

(56) References Cited

U.S. PATENT DOCUMENTS

| | | | |
|---|---|---|---|
| 4,147,596 A | | 4/1979 | Baboian et al. |
| 4,267,505 A | | 5/1981 | Biglin |
| 4,659,975 A | * | 4/1987 | Vincent .................. 318/814 |
| 4,845,435 A | | 7/1989 | Bohan, Jr. |
| 5,124,661 A | | 6/1992 | Zelin et al. |
| 5,139,627 A | * | 8/1992 | Eden et al. ............. 205/775.5 |
| 5,250,909 A | | 10/1993 | Bitts |
| 5,394,093 A | | 2/1995 | Cervas |
| 5,481,194 A | | 1/1996 | Schantz et al. |
| 5,541,516 A | * | 7/1996 | Rider et al. .............. 324/326 |
| 5,606,264 A | | 2/1997 | Licari et al. |
| 5,845,232 A | * | 12/1998 | Shively et al. .............. 702/105 |
| 5,875,413 A | | 2/1999 | Vinci |
| 6,015,484 A | * | 1/2000 | Martinchek et al. ....... 205/775.5 |
| 6,114,856 A | | 9/2000 | Bitts |
| 6,776,889 B2 | * | 8/2004 | Atherton .................. 204/404 |
| 6,987,396 B2 | | 1/2006 | Yang et al. |
| 7,309,414 B2 | * | 12/2007 | Yang .................. 205/775.5 |
| 7,498,823 B2 | * | 3/2009 | Cerutti .................. 324/694 |
| 7,512,503 B2 | | 3/2009 | Bechhoefer et al. |
| 2002/0097034 A1 | | 7/2002 | Tanizawa |
| 2008/0255781 A1 | | 10/2008 | Beard et al. |

FOREIGN PATENT DOCUMENTS

| | | |
|---|---|---|
| EP | 0822418 A2 | 2/1998 |
| JP | H0483182 A | 3/1992 |
| WO | 2004083877 A1 | 9/2004 |

OTHER PUBLICATIONS

International Preliminary Report on Patentability of the International Preliminary Examining Authority mailed by IPEA/US on Oct. 20, 2011 for International Patent Application No. PCT/US10/32657, 3 pages.

Extended European Search Report in related European patent application No. 10770225, 9 pages, mailed Jan. 7, 2014.

Office Action in related Canadian patent application No. 2,759,235, 3 pages, dated May 20, 2014.

* cited by examiner

SYSTEM AND METHOD FOR DETECTING SENSOR LEAKAGE

This invention was made with government support under N00019-09-D-0008 JPBL contract awarded by the Department of Defense. The government has certain rights in the invention.

TECHNICAL FIELD

The present application relates to systems and methods for testing sensors and systems including sensors. In particular, the present application relates to systems and methods for detecting the leakage of an electrical current in sensor systems.

DESCRIPTION OF THE PRIOR ART

Sensors such as those used on various types of vehicles are susceptible to contamination in their connectors that will degrade the sensor signal. This contamination might include such things as hydraulic fluid, gear oil, aluminum particles, and iron particles. This connector contamination is very difficult to detect and corrupts the data that is supplied by the individual vibration sensors to the monitoring computer. It has also been demonstrated that some defective sensors will couple some signal wires to the sensor case. The high impedance continuity between individual pins to connector shell can affect both amplitude and phase of the sensor signal.

Typically, connectors and wiring are tested with a common multimeter that measures continuity between individual sensor wires and the shell of the connector. This technique is not effective in measuring electrical continuity caused by contamination because the typical ohm meter operates at a low voltage of less than one volt. This low voltage is not sufficient to measure continuity through the contaminant. Also, checking individual wires one at a time is very time consuming, especially when there may be dozens of sensors installed for vibration monitoring and multiple wires associated with each sensor.

Other high voltage testers known as hi-pot testers are also available for testing wiring and connectors, but these testers are very expensive (tens of thousands of dollars), bulky, and usually damaging to the sensitive electronics inside the sensors.

Hence, there is a need for an improved system and method for detecting contamination and leakage of electrical current caused by the presence of contamination.

BRIEF DESCRIPTION OF THE DRAWINGS

The novel features believed characteristic of the system of the present application are set forth in the appended claims. However, the system itself, as well as a preferred mode of use, and further objectives and advantages thereof, will best be understood by reference to the following detailed description when read in conjunction with the accompanying drawings, in which the leftmost significant digit(s) in the reference numerals denote(s) the first figure in which the respective reference numerals appear, wherein:

Figure 1A:
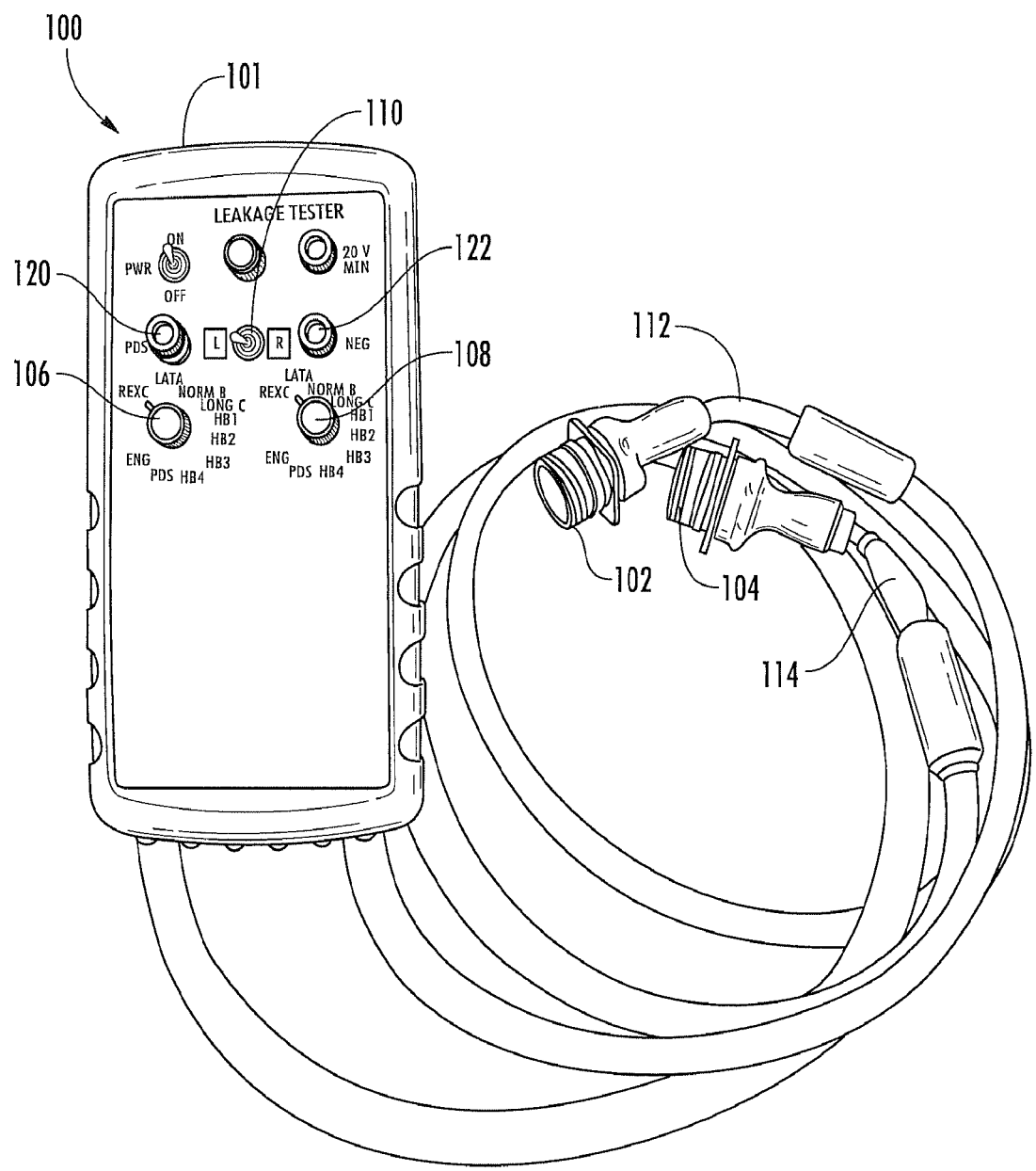
FIG. 1A shows a plan view of a tester according to the present application.

While the system of the present application is susceptible to various modifications and alternative forms, specific embodiments thereof have been shown by way of example in the drawings and are herein described in detail. It should be understood, however, that the description herein of specific embodiments is not intended to limit the method to the particular forms disclosed, but on the contrary, the intention is to cover all modifications, equivalents, and alternatives falling within the spirit and scope of the application as defined by the appended claims.

DESCRIPTION OF THE PREFERRED EMBODIMENT

Illustrative embodiments of the method of the present application are described below. In the interest of clarity, not all features of an actual implementation are described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

In the specification, reference may be made to the spatial relationships between various components and to the spatial orientation of various aspects of components as the devices are depicted in the attached drawings. However, as will be recognized by those skilled in the art after a complete reading of the present application, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

Figure 1B:
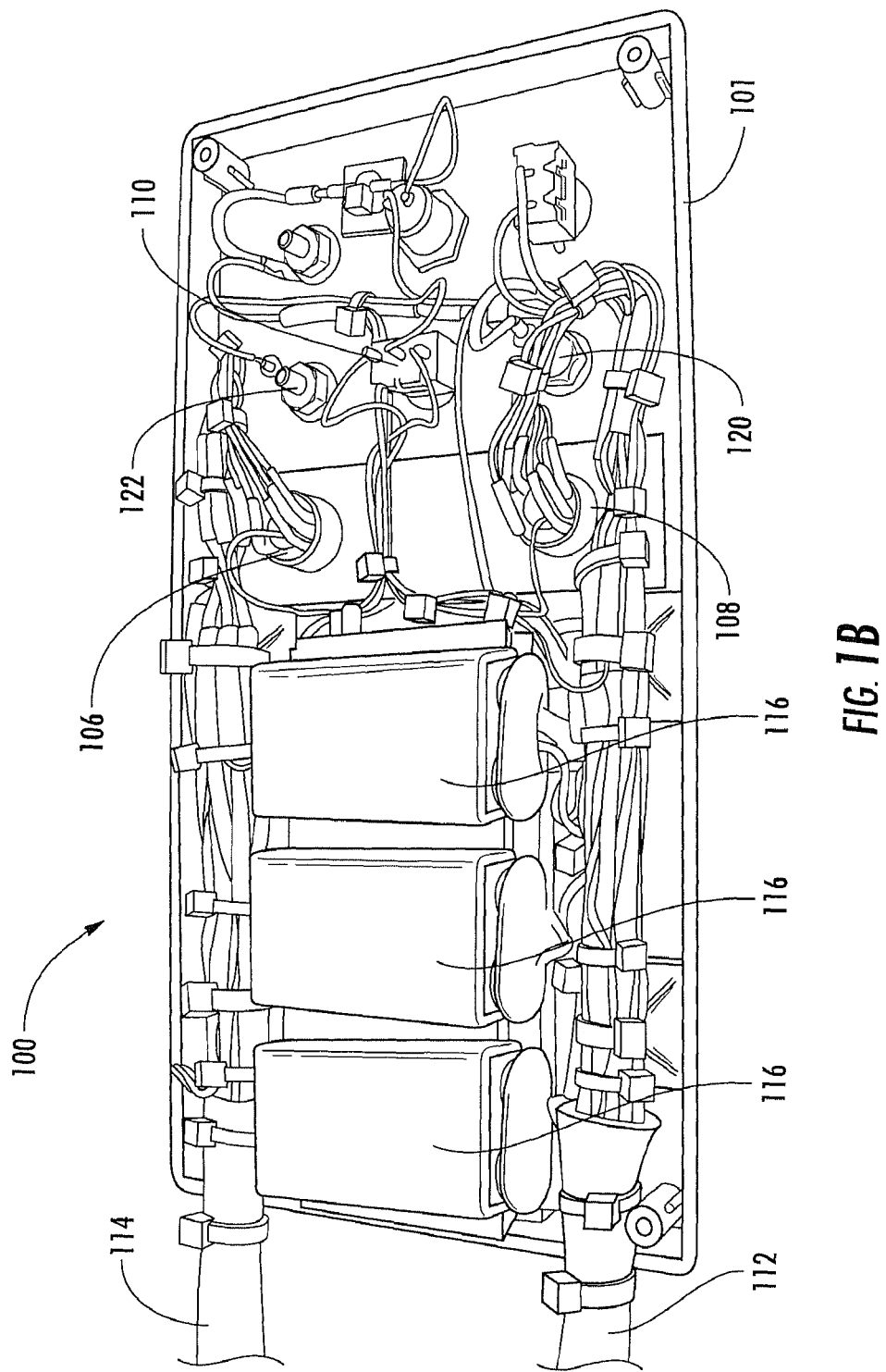
FIG. 1B shows an internal view of the tester shown in FIG. 1A.

Referring first to FIGS. 1A and 1B, disclosed herein is a sensor leakage tester 100. Tester 100 includes connectors 102 and 104 that are configured to connect to the aircraft wiring at the vibration computer disconnect. Tester 100 is a hand-held tester that measures electrical leakage from sensor pins to the connector shell and cable shield. In the preferred embodiment, tester 100 does not require an external power source because it is internally battery powered, which adds to the portability of tester 100. Individual sensors are selected one at a time using the tester rotary switches 106 and 108 and left-right toggle switch 110, thereby enabling a plurality of sensors be tested within only a few minutes. Indications of electrical leakage for each sensor tell the maintainer that the specific sensor should be removed and cleaned, or replaced. A case 101 is configured to enclose the components of tester 100 while also providing a hand-held platform.

Figure 2:
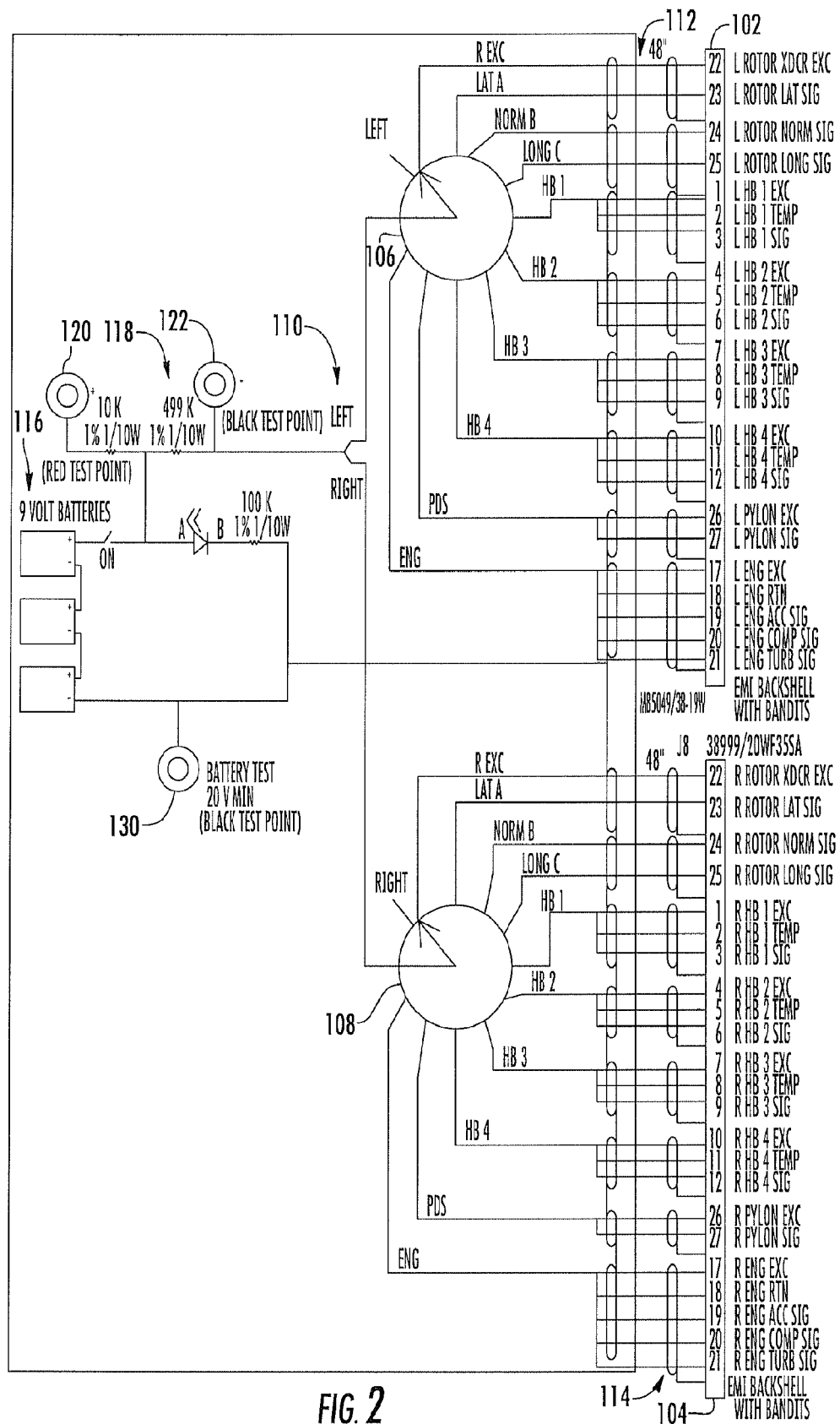
FIG. 2 shows a schematic view of the tester shown in FIG. 1A.

Referring also to FIG. 2, a schematic view is shown of tester 100. Tester 100 includes shielded cables 112 and 114 terminating at connectors 102 and 104, respectively, for connecting the tester 100 to aircraft wiring at the vibration computer disconnect. Through these two cables 112 and 114, all aircraft vibration sensor signals are accessible. It should be appreciated that a fewer or greater number of cables may be used, depending on the configuration of the vibration computer disconnect. Sensor power, signal ground, and signal wires for a given sensor are all tied together inside tester 100. By electrically connecting all of the sensor wires together for a given sensor, damage to the sensor electronics is not possible because all of the sensor wires are at the same electrical potential.

During operation, tester 100 applies a DC voltage (28 VDC in the illustrated embodiment, but other voltages can be used) from batteries 116 to these sensor signals through a high-impedance resistor 118, preferably in a range of 100 k Ohms to 1 M Ohm or more. The 28 VDC provides sufficient voltage at the contaminant to cause ionization of the contaminant, thus rendering the contaminant conductive. In the illustrated embodiment, the resistor 118 is a 499 k Ohm resistor. The battery power return is applied to the aircraft wiring shield (ground) through the mating connector shell. Test points 120 and 122 are provided across the resistor 118 for the operator to monitor with a voltmeter.

Figure 3:
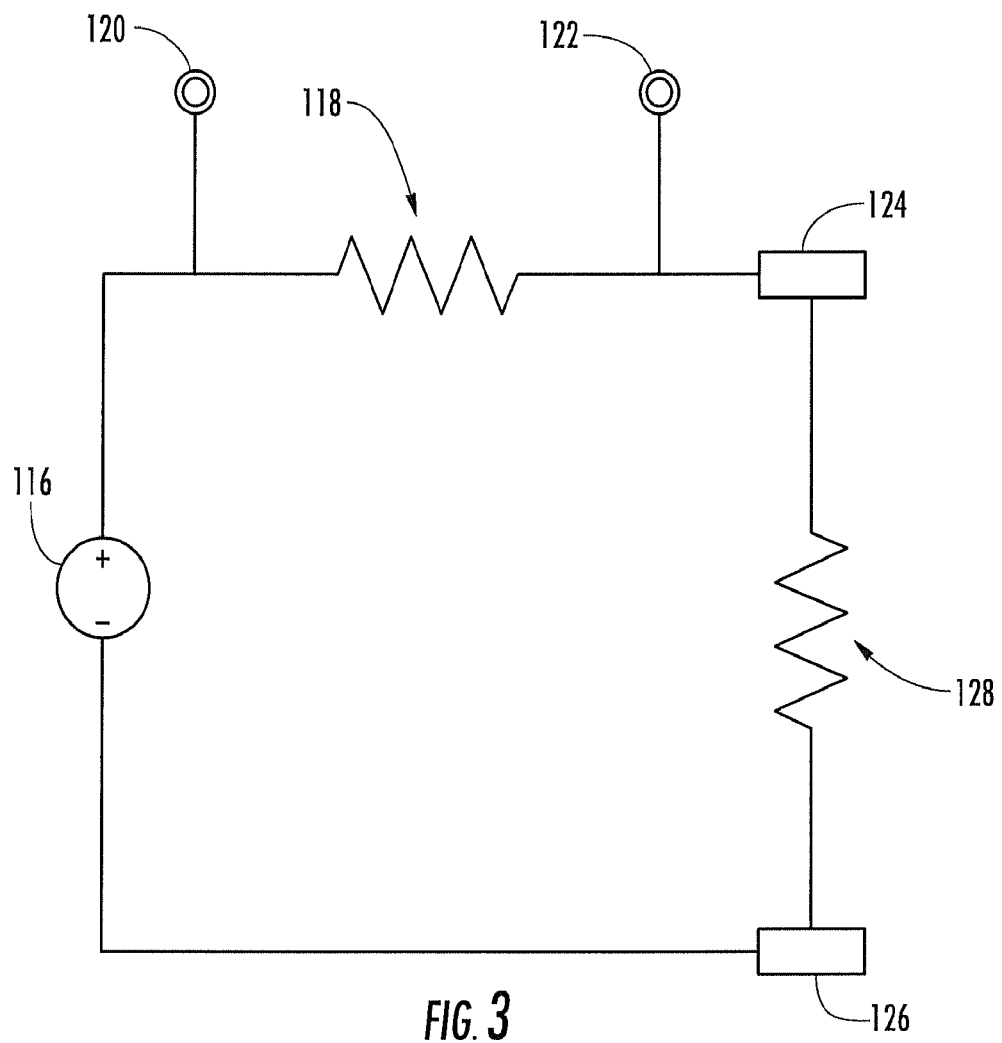
FIG. 3 shows a simplified schematic view of the tester shown in FIGS. 1A, 1B, and 2.

Referring now also to FIG. 3, which shows a simplified schematic view of the tester 100 wherein some elements of the tester 100 are not shown in order to more clearly illustrate the operation of the tester 100. The element 124 is representative of a signal line to a sensor undergoing testing, and the element 126 is representative of signal ground line—such as a shielding, connector housing, or sensor housing—associated with the sensor undergoing testing. The resistor 128 is representative of any defect or foreign substance such as corrosion or other unwanted material that might be allowing unwanted electrical conductance between the signal line 124 and ground 126. The tester 100 is configured to detect the presence and degree of conductance provided by this unwanted material.

The resistor 118 and the resistor 128 constitute a voltage divider. Thus, the voltage across the resistor 118 can be used to determine the amount of leakage from the sensor wires 124 to the sensor case 126. The voltage $V_{R1}$ across the resistor 118 follows the voltage divider equation as shown below in Equation (1):

$$V_{R1} = V_{DC} \frac{R_1}{R_1 + R_2} \quad (1)$$

where $V_{DC}$ is the input voltage from voltage source 116, $R_1$ is the resistance of resistor 118, and $R_2$ is the resistance of the leakage path resistor 128. The voltage $V_{R1}$ is measured across test points 120 and 122, and the input voltage is known or can be measured between test point 120 and battery test point 130 shown in FIG. 2. The resistance $R_1$ is also a known quantity. Thus, Equation (1) can be rearranged as shown below in Equation (2) and used to calculate the amount of leakage resistance $R_2$, which is the inverse of the amount of conductance that may be present due to unwanted foreign substances or defects.

$$R_2 = R_1 \left( \frac{V_{DC}}{V_{R1}} - 1 \right) \quad (2)$$

The Equations (1) and (2) can be used to create a look-up table such as Table 1 below, which an operator or computer can use to determine whether the sensor has passed or failed the test. It should be noted that the values shown in Table 1 are merely exemplary based on the exemplary values of the present embodiment for the voltage $V_{DC}$ and the resistor $R_1$. The values in Table 1 will vary depending on the actual voltages and resistor values used in actual implementations of the tester 100.

TABLE 1

| VOLTS DC | OHMS |
| --- | --- |
| 0.1 | 140M |
| 0.2 | 70M |
| 0.5 | 28M |
| 1.0 | 14M |
| 2.0 | 7M |
| 3.0 | 4M |
| 4.0 | 3M |
| 5.0 | 2.3M |
| 6.0 | 1.8M |
| 7.0 | 1.5M |
| 8.0 | 1.3M |

Figure 4:
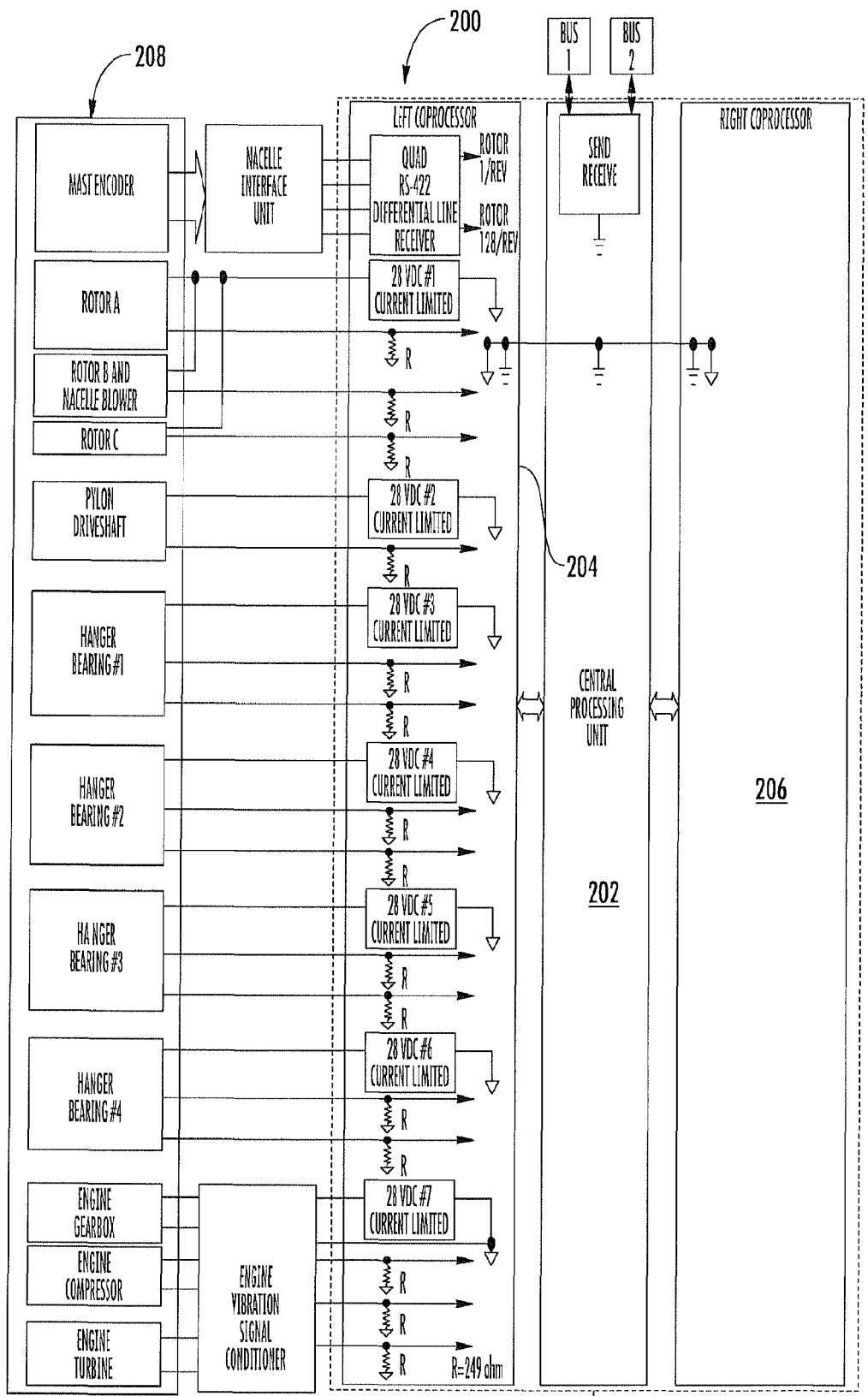
FIG. 4 shows a block diagram of a sensor system that can be tested using the tester shown in FIGS. 1A-3.

Referring now also to FIG. 4, which shows a block diagram of a Health and Usage Monitoring System (HUMS) 200 of an aircraft. The system 200 is shown merely in order to provide an example of a system having sensors that can be tested by tester 100. Other sensor systems can also be tested by various embodiments of tester 100. The system 200 includes a central processing unit 202 in communication with left and right coprocessors 204 and 206. The system 200 also includes a plurality of sensors, generally designated as sensors 208. The rotary switches 106 and 108 in concert with the toggle switch 110 allow the user to select one of the sensors 208 at a time for measurement. The L/R toggle switch 110 allows the user to select the sensors on the left side of the aircraft or select the sensors on the right side of the aircraft.

Figure 5:
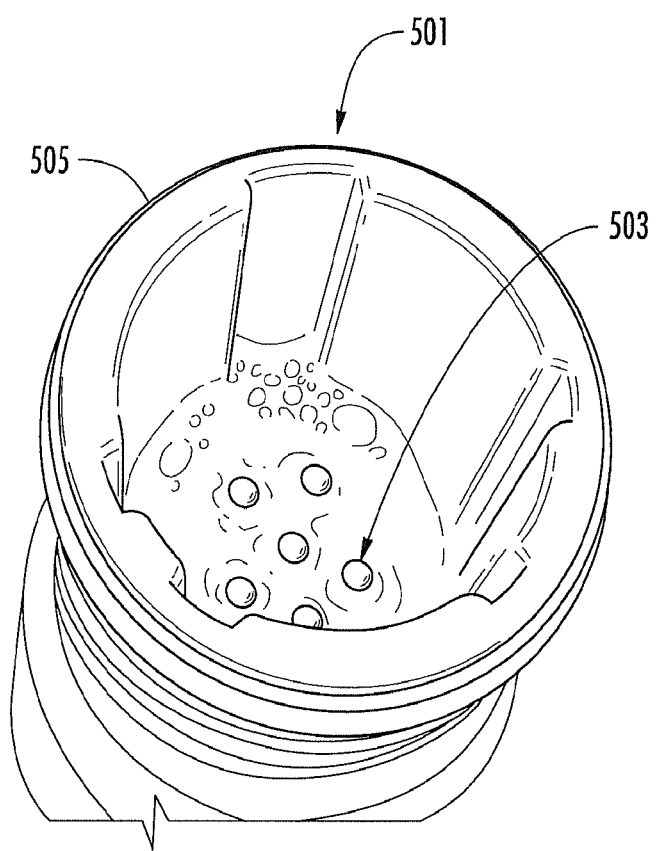
FIG. 5 shows a sensor connector that can be tested using the tester shown in FIGS. 1A-3.

Referring now also to FIG. 5, which shows an exemplary sensor connector 501. Sensor connector 501 has a plurality of sensor pins 503 and a connector shell 505. During testing, tester 100 ties together all the sensor pins 503 associated with a given sensor. Tester 100 uses connector shell 505 as a signal ground line.

It will be appreciated that embodiments of the tester 100 can be made completely portable, inexpensive, and battery operated. However, alternative embodiments can include further complexity. For example, alternative embodiments can include a built-in functionality such as a built-in volt-meter and a processor for determining whether the sensor passes or fails based on the measured voltage across resistor 118. Such alternative embodiments can include a display, such as a pass/fail indicator, for displaying the test results.

It will also be appreciated that alternative values can be measured other than the voltage across resistor 118 for determining a pass/fail condition. For example, the amount of electrical current passing through resistor 118 can instead be measured, and the pass/fail condition can be determined based on the amount of electrical current, or based on a calculated voltage, where the voltage is calculated using the known resistance of resistor 118 and the measured current according to Ohm's Law (V=IR).

The tester 100 can test for electrical current leakage from a signal line to shield or other ground in a convenient effective way without risking damage to the sensors. Testing all of a plurality of an aircraft's (or other vehicle's) sensors' wiring can be achieved in only a few minutes using the rotary switches 106 and 108 instead of hours or days compared to conventional ohmmeter or hi-pot testers. The tester 100 provides enough voltage to sense the leakage current without risk of damage to the sensors or the sensor wiring. Damage to sensors is not possible because all of the sensor wires are electrically connected to the same potential.

Thus, disclosed herein is a test system for testing a sensor system, where the test system comprises a test-system connector, a high-impedance resistor, a selector switch, a voltage source, and first and second test points. The test-system connector is configured for mating with a sensor-system connector. The test-system connector comprises a conductive housing, first and second conductive signal leads, and insulating material. The insulating material is disposed between the first and second signal leads, and the insulating material is also disposed between the housing and each of the first and second signal leads. The high-impedance resistor is connected between the housing and the signal leads. The selector switch includes first and second selector-switch positions, where the high-impedance resistor is electrically connected to the first conductive signal lead when the selector switch is in the first selector-switch position, and where the high-impedance resistor is electrically connected to the second conductive signal lead when the selector switch is in the second selector-switch position. The voltage source is configured for applying a voltage between the high-impedance resistor and the conductive housing of the test-system connector. The first and second test points allow for measuring the voltage across the high-impedance resistor while the voltage is being applied. The measured voltage across the high-impedance resistor can then be used to determine whether there is any leakage current in the sensor system.

The particular embodiments disclosed above are illustrative only, as the application may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the application. Accordingly, the protection sought herein is as set forth in the claims below. It is apparent that an application with significant advantages has been described and illustrated. Although the present application is shown in a limited number of forms, it is not limited to just these forms, but is amenable to various changes and modifications without departing from the spirit thereof.

The invention claimed is:

1. A sensor test system, comprising:
a case configured to house a circuit;
a power source for producing a voltage;
a cable electrically connecting a first sensor to the circuit;
  the first sensor comprising multiple connector pins and a grounded connector shell;
wherein the circuit comprises:
  a high-impedance resistor connected between the power source and a common connection of the multiple connector pins such that the connector pins remain at a electrical potential;
  a first voltage test point and a second voltage test point across the high-impedance resistor;
  a common return line from the grounded connector shell to the power source, such that each of the multiple connector pins remain at the same electrical potential having a single voltage source and a single return path, the voltage produced from the power source renders a contaminant between the connector pins and the connector shell conductive, in that the contaminant provides conductive path between the connector pins and the grounded connector shell, while the contaminant also provides a contaminant resistance;
wherein interpretation of a measured voltage between the first voltage test point and the second voltage test point provides an indication of the contaminant due to the contaminant resistance affecting the measured voltage.

2. The sensor test system of claim 1, wherein the voltage is approximately 28 volts.

3. The sensor test system of claim 1, wherein the connector pins are electrically tied together within the circuit so as to prevent damage during a test procedure.

4. The sensor test system of claim 1, further comprising:
a voltmeter for measuring the voltage across the first voltage test point and the second voltage test point.

5. The sensor test system of claim 4, wherein the voltmeter is external to the case.

6. The sensor test system of claim 1, further comprising:
a second sensor connected to the circuit with the cable;
a switch for selectively changing electrical connectivity of the circuit between the first sensor and the second sensor.

7. The sensor test system of claim 1, wherein the high-impedance resistor is between 100 k Ohms and 1 M Ohms.

8. The sensor test system of claim 1, wherein the indication of the contaminant represents a quantity of the contaminant.

9. The sensor test system of claim 1, wherein the indication of the contaminant represents a presence of the contaminant.

10. The sensor test system of claim 1, further comprising:
a built-in processor for determining whether the indication of the contaminant represents an unacceptable amount of the contaminant.

11. A method for detecting a leakage in a sensor with a tester, comprising:
using a circuitry in the tester to electrically couple a plurality of connector pins, the connector pins being located in a connector shell;
applying a source voltage to the circuitry, the circuitry including a high-impedance resistor located between the plurality of connector pins and the source voltage, a common connection of the multiple connector pins such that the connector pins remain at a same electrical potential having a single voltage source and a single return path, the circuitry being configured such that a contamination between the connector pins and the connector shell becomes conductive upon applying the source voltage;
taking a voltage reading across the high-impedance resistor; and
interpreting the voltage reading so as to determine an amount of the leakage resulting from the contamination.

12. The method according to claim 11, wherein the interpreting the voltage reading includes using a look-up table, the look-up table having predetermined relationships between the voltage readings and a resistance, the resistance being an indication of an extent of the leakage.

13. The method according to claim 11, wherein the interpreting the voltage reading includes using a processor in the tester, the processor being configured to use an internal look-up table for calculating an extent of the leakage.

14. The method according to claim 13, wherein the processor is configured to output a pass/fail reading on a display of the tester.

15. The method according to claim 11, wherein the taking a voltage reading includes using an external volt-meter to take the voltage reading across the high-impedance resistor.

16. The method according to claim 11, wherein the applying the source voltage to the circuitry includes switching on a power switch which applies the source voltage from at least one battery in the tester.

\* \* \* \* \*